(12) United States Patent
Owczarczyk et al.

(10) Patent No.: US 10,797,712 B1
(45) Date of Patent: Oct. 6, 2020

(54) MAINTAINING A DIGITALLY CONTROLLED OSCILLATOR AT AN IDEAL STATE BY CHANGING THE VOLTAGE SUPPLY

(71) Applicant: International Business Machines Corporation, Armonk, NY (US)

(72) Inventors: Pawel Owczarczyk, Highland, NY (US); Michael Sperling, Poughkeepsie, NY (US); Miguel E. Perez, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/562,466

(22) Filed: Sep. 6, 2019

(51) Int. Cl.
| | |
|---|---|
| H03D 3/24 | (2006.01) |
| H03L 7/099 | (2006.01) |
| H03L 7/093 | (2006.01) |
| H03L 5/00 | (2006.01) |
| H03L 7/07 | (2006.01) |

(52) U.S. Cl.
CPC ........... H03L 7/0991 (2013.01); H03L 5/00 (2013.01); H03L 7/07 (2013.01); H03L 7/093 (2013.01); H03L 7/0997 (2013.01); H03L 2207/06 (2013.01)

(58) Field of Classification Search
CPC ..... H03L 7/0991; H03L 7/0997; H03L 7/093; H03L 5/00; H03L 7/07; H03L 2207/06; H03L 7/099

USPC .................................... 375/373-376
See application file for complete search history.

(56) References Cited

U.S. PATENT DOCUMENTS

| | | | |
|---|---|---|---|
| 2013/0222067 A1* | 8/2013 | Yin | H03L 7/099 331/25 |
| 2013/0307631 A1 | 11/2013 | Lotfy et al. | |
| 2015/0002505 A1 | 1/2015 | Vandepas | |
| 2016/0006443 A1 | 1/2016 | Lofty et al. | |
| 2016/0365866 A1 | 12/2016 | Li et al. | |
| 2019/0036534 A1 | 1/2019 | Deng et al. | |

FOREIGN PATENT DOCUMENTS

WO 2016048485 A2 3/2016

* cited by examiner

Primary Examiner — Phuong Phu
(74) Attorney, Agent, or Firm — Cantor Colburn LLP; William Kinnaman

(57) ABSTRACT

A technique relates to a digital phase locked loop (DPLL) including a digitally controlled oscillator (DCO), the DCO having delay elements and a current fill factor corresponding to a proportion of the delay elements in operation. A voltage regulator controller is operable to obtain a result of a comparison between a predefined fill factor and the current fill factor, the voltage regulator controller being operable to adjust voltage supplied to the DCO based on the result, the predefined fill factor indicating a predetermined proportion of the delay elements to be in operation.

20 Claims, 7 Drawing Sheets

MAINTAINING A DIGITALLY CONTROLLED OSCILLATOR AT AN IDEAL STATE BY CHANGING THE VOLTAGE SUPPLY

BACKGROUND

The present invention generally relates to the field of digital phase locked loops (DPLLs), and more specifically, to maintaining a digitally controlled oscillator (DCO) at an ideal state by changing the voltage supply.

A phase-locked loop or phase lock loop (PLL) is a control system that generates an output signal whose phase is related to the phase of an input signal. There are several different types. The simplest is an electronic circuit consisting of a variable frequency oscillator and a phase detector with a filtered output in a feedback loop. The oscillator generates a periodic signal, and the phase detector compares the phase of that output signal with the phase of the input periodic signal, thereby adjusting the oscillator through the loop filter to keep the phases matched.

SUMMARY

Embodiments of the invention are directed to an apparatus. A non-limiting example of the apparatus includes a digital phase locked loop (DPLL) including a digitally controlled oscillator (DCO), the DCO having delay elements and a current fill factor corresponding to a proportion of the delay elements in operation. Also, the apparatus includes a voltage regulator controller operable to obtain a result of a comparison between a predefined fill factor and the current fill factor, the voltage regulator controller being operable to adjust voltage supplied to the DCO based on the result, the predefined fill factor indicating a predetermined proportion of the delay elements to be in operation.

Embodiments of the invention are directed to method. A non-limiting example of the method includes obtaining, by a voltage regulator controller, a result of a comparison between a predefined fill factor and a current fill factor, wherein a digital phase locked loop (DPLL) includes a digitally controlled oscillator (DCO), the DCO including delay elements, the current fill factor corresponding to a proportion of the delay elements in operation. Also, the method includes adjusting, by the voltage regulator controller, voltage supplied to the DCO based on the result, the predefined fill factor indicating a predetermined proportion of the delay elements to be in operation.

Embodiments of the invention are directed to an apparatus. A non-limiting example of the apparatus includes a digital phase locked loop (DPLL) including a digitally controlled oscillator (DCO) having delay elements, a digital loop filter coupled to the DCO, and a phase detector coupled to the digital loop filter, wherein a current fill factor corresponds to a proportion of the delay elements in operation. Also, the apparatus includes a voltage regulator controller operable to obtain a result of a comparison between a predefined fill factor and the current fill factor, the voltage regulator controller being operable to cause a voltage regulator to adjust voltage supplied to the DCO based on the result, the predefined fill factor indicating a predetermined proportion of the delay elements to be in operation.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
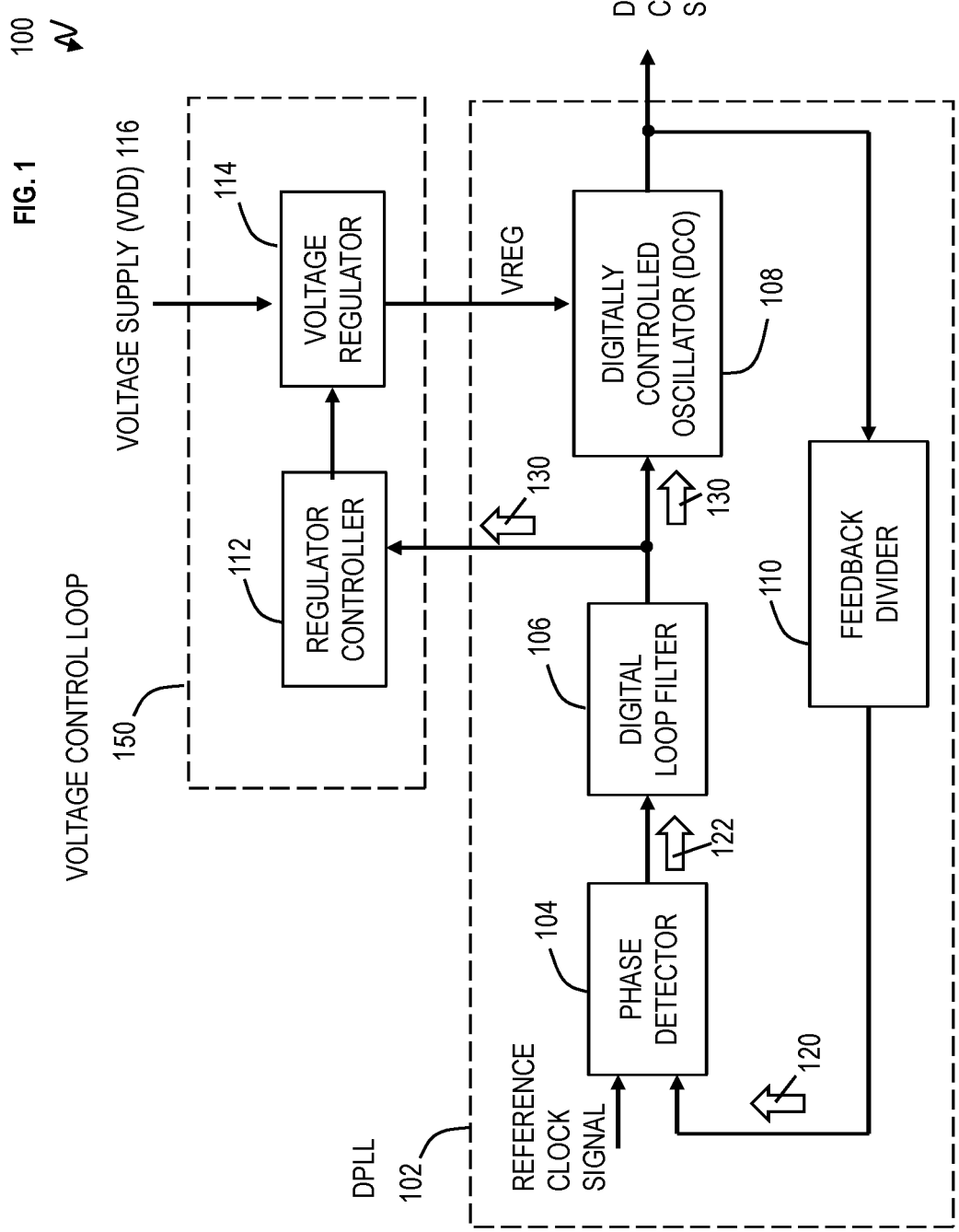
FIG. 1 depicts an example system according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

One or more embodiments of the invention are configured to keep a digitally controlled oscillator (DCO) at an ideal state by changing the voltage supply. A digital loop filter is configured to initialize the DCO by changing the voltage level until the array of inverters is at some predetermined percent full (e.g., from about 80% to about 90% of the inverters turned on), which is the ideal state. The digital loop filter then continuously monitors the percent full of the number of inverters and moves the power supply voltage level up and down (e.g., via a voltage regulator) to keep the percent full in an ideal range. The percent full is the proportion of inverters powered on versus the inverters powered off in the DCO.

In order to keep the frequency of a DCO clock signal output by the DCO at the desired level, inverters will frequently have to be turned on and off. It can be beneficial in a circuit to reduce jitter in an oscillator made up of a sequence of invertors operating in parallel (an array of inverters) in a loop. The array of inverters may be utilized by the DCO which produces a periodic, oscillating signal such as a clock signal. Methods of keeping an oscillator at a desired frequency range include turning inverters on or off to keep the frequency within the desired range. Turning inverters on and off can introduce jitter into the circuit. However, by having a large number of inverters (e.g., 100, 500, 1000, or more) in the DCO turned on at any given time, the jitter introduced by one inverter being turned on or off is smaller when compared to oscillators that have a smaller number of inverters turned on (i.e., a smaller percent full). Accordingly, embodiments of the invention reduce the jitter in the oscillator (i.e., DCO) when compared to conventional techniques which do not use a voltage regulator to adjust the power supply voltage (up or down) to maintain the ideal percent full (e.g., from about 80% to about 90% of the inverters turned on) and which do not use a large number of inverters. The number of inverters impacts the frequency of the DCO. In general, more inverters have to be powered on to increase the frequency when the voltage decreases.

Particularly, embodiments of the invention are configured to use a voltage regulator to change the value of the voltage, which is in contrast to the state-of-the-art where the voltage is constant. Even if the state-of-the-art were to change the voltage, the state-of-the art fails to maintain and is not concerned maintaining the ideal percent full as, for example, between about 80% to about 90% of the inverters powered on in the DCO. Rather, the state-of-the-art may typically have a low percentage (e.g., 25%) of the available inverters turned on at any given time. Because embodiments of the invention use more inverters as the ideal percent full and a lower voltage when compared to the state-of-the-art, the number of inverters turned on at any given time is optimized to reduce jitter and turning on/off any one inverter has less of an impact according to embodiments of the invention. In a digital phase locked loop system, the standard control loop will need to continuously vary the number of inverters on or off to keep up with changes in the environment such as temperature, process drift, etc. Therefore, unlike embodiments, the state-of-the-art would not have the DCO run too close to 100% full (e.g., would not be 80% to about 90% full), as doing so may cause the DPLL control loop to be unable to adjust the output frequency and phase. However, one or more embodiments of the invention actually run the DCO with as large a percent full as possible without ever coming too close to being 100% full.

Figure 2:
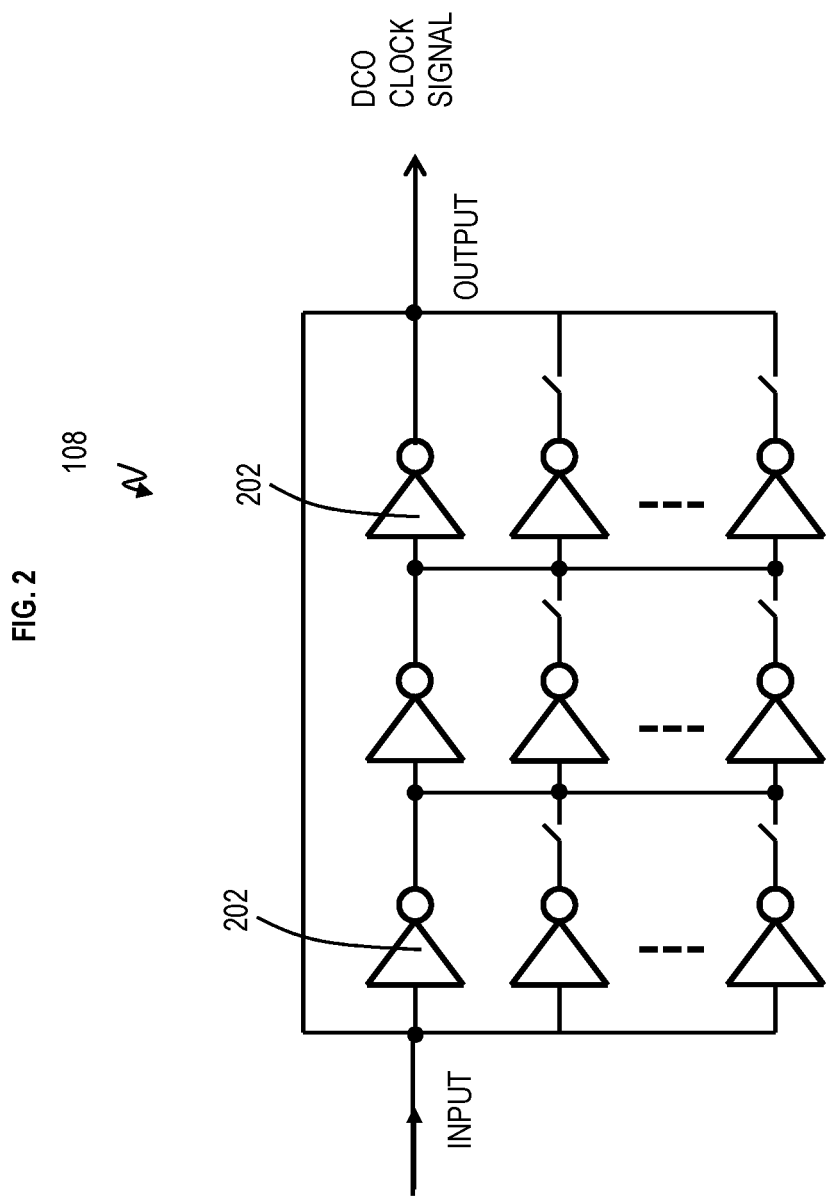
FIG. 2 depicts an example digitally controlled oscillator (DCO) according to embodiments of the invention.

Turning now to a more detailed description of aspects of the present invention, FIG. 1 depicts an example system 100 according to embodiments of the invention. The system 100 includes a digital phase locked loop (DPLL) 102. In the system 100, the DPLL 102 includes a phase detector 104 which is configured to compare the phases (or the frequencies) of an input reference clock signal and a feedback clock signal 120 and to generate a difference output 122. The difference output 122 indicates a phase difference (or frequency difference) between the reference clock signal and the feedback clock signal 120. A feedback divider 110 is configured to divide a DCO clock signal from a digitally controlled oscillator (DCO) 108 and generate the feedback clock signal 120. The DCO 108 can include a chain of delay elements 202 connected in a ring, for example, as a ring oscillator as depicted in FIG. 2. As depicted in FIG. 2, the delay elements 202 may include a chain of inverters in the DCO 108. There are extra delay elements 202 configured such that they can be turned on or off in parallel to a primary set of inverters. This has the effect of either speeding up the signal or slowing down the signal by respectively either adding or removing inverters. In other examples, there are more than three inverters in series. In other examples, the delay elements 202 may include a chain of buffers and one inverting phase.

Figure 5:
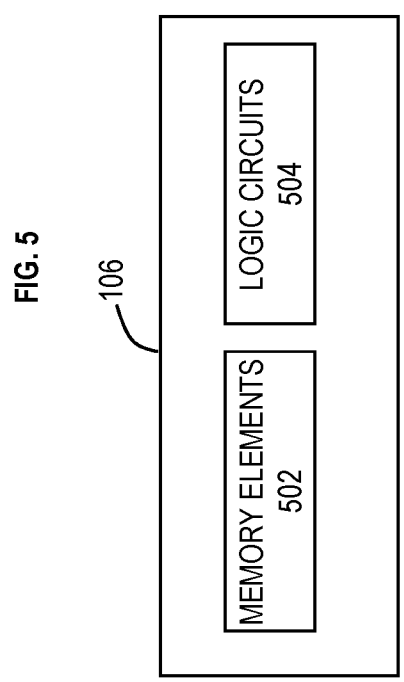
FIG. 5 depicts example components of a digital loop filter according to embodiments of the invention.

A digital loop filter 106 receives the difference output 122. As an example, a positive value for the difference output 122 can inform the digital loop filter 106 that the frequency of the DCO 108 needs to be increased by an amount while a negative value for the difference output 122 can inform the digital loop filter 106 that the frequency of the DCO 108 needs to be decreased by an amount (or vice versa). The digital loop filter 106 is operable to perform various functions and operations as discussed herein according to embodiments of the invention. FIG. 5 depicts some example components of the digital loop filter 106 according to embodiments of the invention. The digital loop filter 106 includes logic circuits 504 coupled to the memory elements 502, and the logic circuits 504 are configured to operate and function as discussed herein. For example, the logic circuits 504 have the logic to generate and output the output code 130 for controlling the DCO 108 based on the difference output 122 received from the phase detector 104. According to the magnitude for the positive value or negative value of difference output 122, the output code 130 includes instructions and/or bits that increase or decrease the frequency of the DCO 108 accordingly, which requires more delay elements 202 to be powered on to increase the frequency or powered off to decrease the frequency.

An example scenario is provided below for a predetermined fill factor of 85% as the ideal state of the DCO 108, and it should be understood that the embodiments of the invention are not meant to be limited to the fill factor of 85%. The digital loop filter 106 is configured to initialize the DCO 108 with an output code 130 or control signal which sets the DCO 108 to the predefined fill factor. The digital loop filter 106 can store the value of the predetermined fill factor in the memory elements 502. As noted above, the fill factor is a percent full of delay elements 202 that are powered on in the DCO 108. In this example scenario, the digital loop filter 106 stores the value of the predefined fill as 85% in advance, and this predefined fill factor is used as discussed herein. Since the fill factor can range from about 80% to about 90% of the delay elements being turned on in the DCO 108 as controlled by the digital loop filter 106, some implementations could have the predetermined fill factor as 80%, 85%, 90%, etc.

Referring back to the example scenario, at the start, the digital loop filter 106 is configured to output the output code 130 which initially defines the fill factor as, for example, 85% of the delay elements (e.g., inverters) being powered on in the DCO 108. In the DPLL 102, the phase detector 104, digital loop filter 106, DCO 108, and feedback divider 110 operate to create a phase lock between the input reference clock signal and the DCO clock signal output from the DCO 108. The DPLL 102 runs to match or lock the phase of the input reference clock signal to the phase of the output DCO clock signal by having the digital loop filter 106 adjust the DCO 108 to keep the phases matched. Keeping the input and output phases in lock step also implies keeping the input and output frequencies as multiples in the input reference clock signal and output DCO clock signal, where the frequency of the DCO clock signal is a multiple of the frequency of the input reference clock signal. Because the digital loop filter 106 had to adjust the DCO 108 to find the phase lock to match the phases (or frequencies) of the reference clock signal and feedback clock signal 120 (which is related to the DCO clock signal and/or the quotient of the DCO clock signal) in the DPLL 102, the current state of the fill factor of the DCO 108 may be different from the predefined fill factor (e.g., 85% full) intended for the DCO 108. The DPLL 102 is a fast loop for reacting to the phase difference (represented in the difference output 122) and correcting the phase difference between the reference clock signal and feedback clock signal 120, while voltage control loop 150 is a slow loop configured to ensure that the predefined fill factor (e.g., 85%) is met and/or eventually met such that the current state for the fill factor in the DCO 108 matches and/or eventually matches the predefined fill factor (e.g., 85%).

In the example scenario, the current state of the fill factor of the DCO 108 has been found for a constant voltage VREG applied to the DCO 108, where the voltage VREG is regulated/maintained by a voltage regulator 114 connected to a voltage supply (VDD) 116. The slow voltage control loop 150 includes the voltage regulator controller 112 and the voltage regulator 114, where the voltage regulator 114 controls the voltage regulator 114 to output the voltage VREG to the DCO 108. For explanation purposes, it is assumed that the current state of the fill factor (e.g., 75% powered on) of the DCO 108 is lower than the predefined fill factor of 85%, and this information is output to the voltage regulator controller 112 via output code 130 from the digital loop filter 106, while in other cases the current state of the fill factor could be higher. Just as in the digital loop filter 106, the voltage regulator controller 112 has both the predefined fill factor which is the ideal state and the current state of the fill factor of the DCO 108. Although examples of decision making for controlling the voltage VREG applied to the DCO 108 are discussed with respect to the voltage regulator controller 112, it should be appreciated that the decision making can be performed by the digital loop filter 106.

The voltage regulator controller 112 (and/or digital loop filter 106) is configured to compare the value of the predefined fill factor (e.g., 85) to the value of the current state of the fill factor (e.g., 75%). When the predefined fill factor is greater than the current state of the fill factor, the voltage regulator controller 112 is configured (and/or digital loop filter 106 causes the voltage regulator controller 112) to instruct the voltage regulator 114 to decrease the value of the voltage VREG applied to the DCO 108. As such, this lower voltage to DCO 108 causes the frequency or phase of the DCO clock signal to decrease, which is detected by the phase detector 104 via the feedback divider 110. Consequently, the digital loop filter 106 causes the DCO 108 to turn on more delay elements thereby increasing the current state of the fill factor in order for the phases (or frequencies) of the reference clock signal and the feedback clock signal 120 to match.

The voltage regulator controller 112 receives the current state of the fill factor which has increased from before, and again, the voltage regulator controller 112 (and/or digital loop filter 106) is configured to compare the value of the predefined fill factor to the value of the current state of the fill factor. As noted above, when the predefined fill factor is greater than the current state of the fill factor, the voltage regulator controller 112 (and/or digital loop filter 106 causes the voltage regulator controller 112) instructs the voltage regulator 114 to further decrease the value of the voltage VREG applied to the DCO 108, and the process continues for the slow voltage control loop 150 and DPLL 102 until the phases (or frequencies) of the reference clock signal and the feedback clock signal 120 match (i.e., lock) at the predetermined fill factor of 85%.

It should be appreciated that an analogous process occurs when the predefined fill factor is lower than the current state of the fill factor for the DCO 108. For explanation purposes, it is assumed that the current state of the fill factor (e.g., 95% turned on) of the DCO 108 is greater than the predefined fill factor of 85%, and this information is output to the voltage regulator controller 112 via output code 130 from digital loop filter 106. Just as in the digital loop filter 106, the voltage regulator controller 112 has both the predefined fill factor (e.g., the ideal state) and the current state of the fill factor of the DCO 108. The voltage regulator controller 112 (and/or digital loop filter 106) is configured to compare the value of the predefined fill factor (e.g., 85%) to the value of the current state of the fill factor (e.g., 95%). When the predefined fill factor is less than the current state of the fill factor, the voltage regulator controller 112 is configured (and/or digital loop filter 106 causes the voltage regulator controller 112) to instruct the voltage regulator 114 to increase the value of the voltage VREG applied to the DCO 108. As such, this higher voltage to DCO 108 causes the frequency or phase of the DCO clock signal to increase, which is detected by the phase detector 104 via the feedback divider 110. Consequently, the digital loop filter 106 causes the DCO 108 to turn off delay elements thereby decreasing the current state of the fill factor in order for the phases (or frequencies) of the reference clock signal and the feedback clock signal 120 to match (again).

The voltage regulator controller 112 receives the current state of the fill factor which has now decreased from before, and again, the voltage regulator controller 112 (and/or digital loop filter 106) is configured to compare the value of the predefined fill factor to the value of the current state of the fill factor. As noted above, when the predefined fill factor is lower than the current state of the fill factor, the voltage regulator controller 112 (and/or digital loop filter 106 causes the voltage regulator controller 112) again instructs the voltage regulator 114 to further increase the value of the voltage VREG applied to the DCO 108, and the process continues for the slow voltage control loop 150 and DPLL 102 until the phases (or frequencies) of the reference clock signal and the feedback clock signal 120 match (i.e., lock) at the predetermined fill factor.

Although the slow voltage control loop 150 can begin operating about the time of and/or after the phase lock has occurred, in some implementations adjusting of the voltage VREG can begin prior to phase lock.

Functions and operations of the phase detector 104, digital loop filter 106, DCO 108, feedback divider 110, and voltage regulator controller 112 can be implemented using circuits including logic circuits, modules, memory elements, processors/microprocessors, etc. The various components, modules, engines, etc., that may be utilized in FIG. 1 can be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In examples, the engine(s) described herein can be a combination of hardware and programming. The programming can be processor executable instructions stored on a tangible memory, and the hardware can include processing circuitry for executing those instructions. Thus a system memory can store program instructions that when executed by processing circuitry implement the engines described herein. Other engines can also be utilized to include other features and functionality described in other examples herein. Alternatively or additionally, the modules can include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein.

Figure 3:
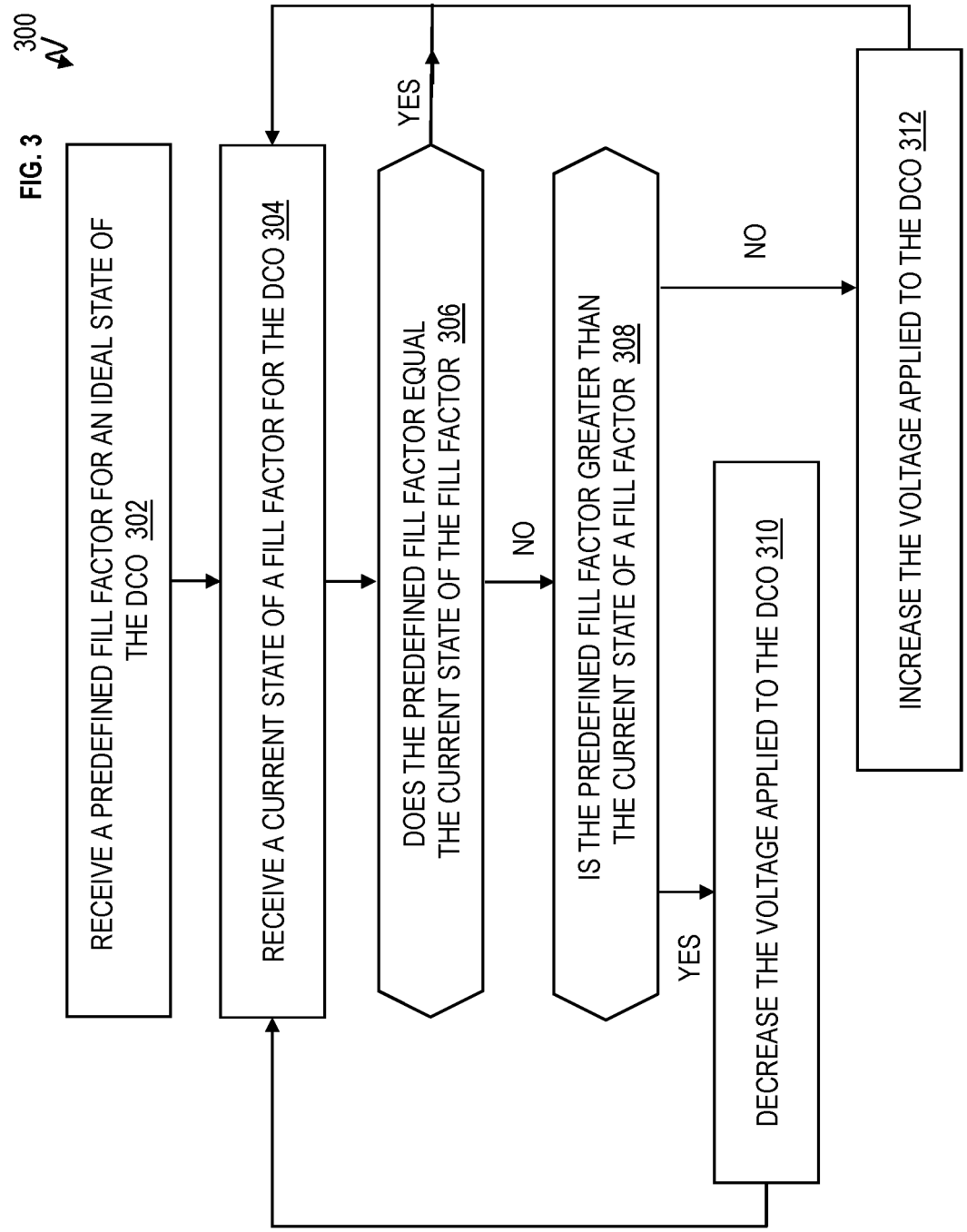
FIG. 3 depicts a flowchart of a process of maintaining the DCO at an ideal state by changing the voltage from a voltage supply according to embodiments of invention.

FIG. 3 depicts a flowchart of a process of maintaining the DCO at an ideal state by changing the voltage from a voltage supply according to embodiments of invention. Initially, the voltage output from the voltage regulator 114 to the DCO 108 is maintained at a constant value for voltage VREG, such that a phase lock (or match) can be quickly achieved in the fast loop DPLL 102.

Figure 4:
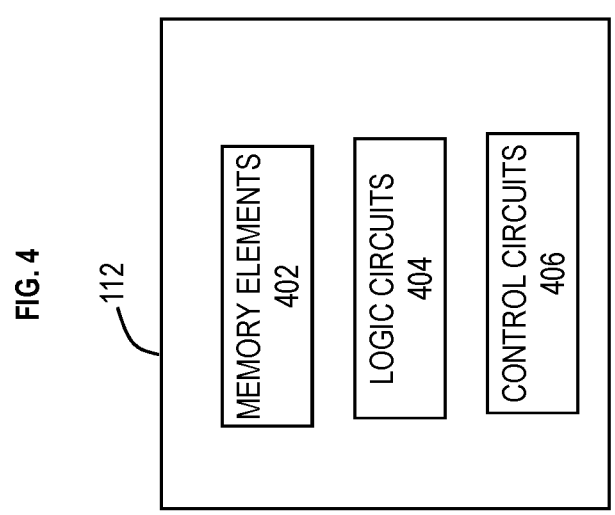
FIG. 4 depicts example components of the voltage regulator controller according to embodiments of the invention.

At block 302, the voltage regulator controller 112 is configured to receive the predefined fill factor in output code 130 from the digital loop filter 106, which may occur when the DPLL 102 initially starts, for example, initially powered on. The voltage regulator controller 112 can include and store the predefined fill factor in a memory elements 402 in FIG. 4. In some examples, the memory elements 402 could include registers or latches. FIG. 4 depicts example components of the voltage regulator controller 112 according to embodiments of the invention. The voltage regulator controller 112 includes logic circuits 404 coupled to the memory elements 402 and to control circuits 406. The control circuits 406 are designed to control the voltage applied by the voltage regulator 114, and the control circuits 306 can control one or more switches, transistors, etc., in the voltage regulator 114 as understood by one skilled in the art. The logic circuits 404 and control circuits 406 are configured to operate and function as discussed herein. The predefined fill factor can be set in advance and stored in memory elements 502 of the digital loop filter 106 and then sent to the voltage regulator controller 112.

At block 304, the voltage regulator controller 112 is configured to receive a current state of the fill factor for the DCO 108 from the digital loop filter 106. The voltage regulator controller 112 can store the current state of the fill factor in the memory element 402. At block 306, the voltage regulator controller 112 includes logic circuits 404 which are configured to compare whether the predefined fill factor equals and/or about equals (i.e., equals within a predefined threshold) the current state of the fill factor of DCO 108. The logic circuits 404 can include a comparator to make the comparison. If 'yes' to block 306, the voltage regulator controller 112 is configured to monitor the digital loop filter 106 and wait for the next update to the current state of the fill factor for the DCO 108. The update could be an increase or decrease to the current state of the fill factor for the DCO 108. If "no" to block 306, the voltage regulator controller 112 (using logic circuits 404) is configured to check whether the predefined fill factor is greater than the current state of the fill factor of the DCO 108 at block 308.

If 'yes' to block 308, the voltage regulator controller 112 is configured to decrease the voltage VREG applied to the DCO 108 at block 310. For example, the logic circuits 404 can send a control signal to the voltage regulator 114 which causes the voltage regulator 114 to decrease the value of voltage VREG supplied to the DCO 108. The lower value for the voltage VREG supplied to the DCO 108 causes the DCO 108 to power on more delay elements 202 to increase the frequency of the DCO clock signal, thereby increasing the current state of the fill factor for the DCO 108. If 'no' to block 308, the voltage regulator controller 112 is configured to increase the voltage VREG applied to the DCO 108 at block 312. For example, the logic circuits 404 can send a control signal to the voltage regulator 114 which then causes the voltage regulator 114 to increase the value of voltage VREG supplied to the DCO 108. The higher value for the voltage VREG supplied to the DCO 108 causes the DCO 108 to power off more delay elements 202 to decrease the frequency of the DCO clock signal, thereby decreasing the current state of the fill factor for the DCO 108.

Figure 6:
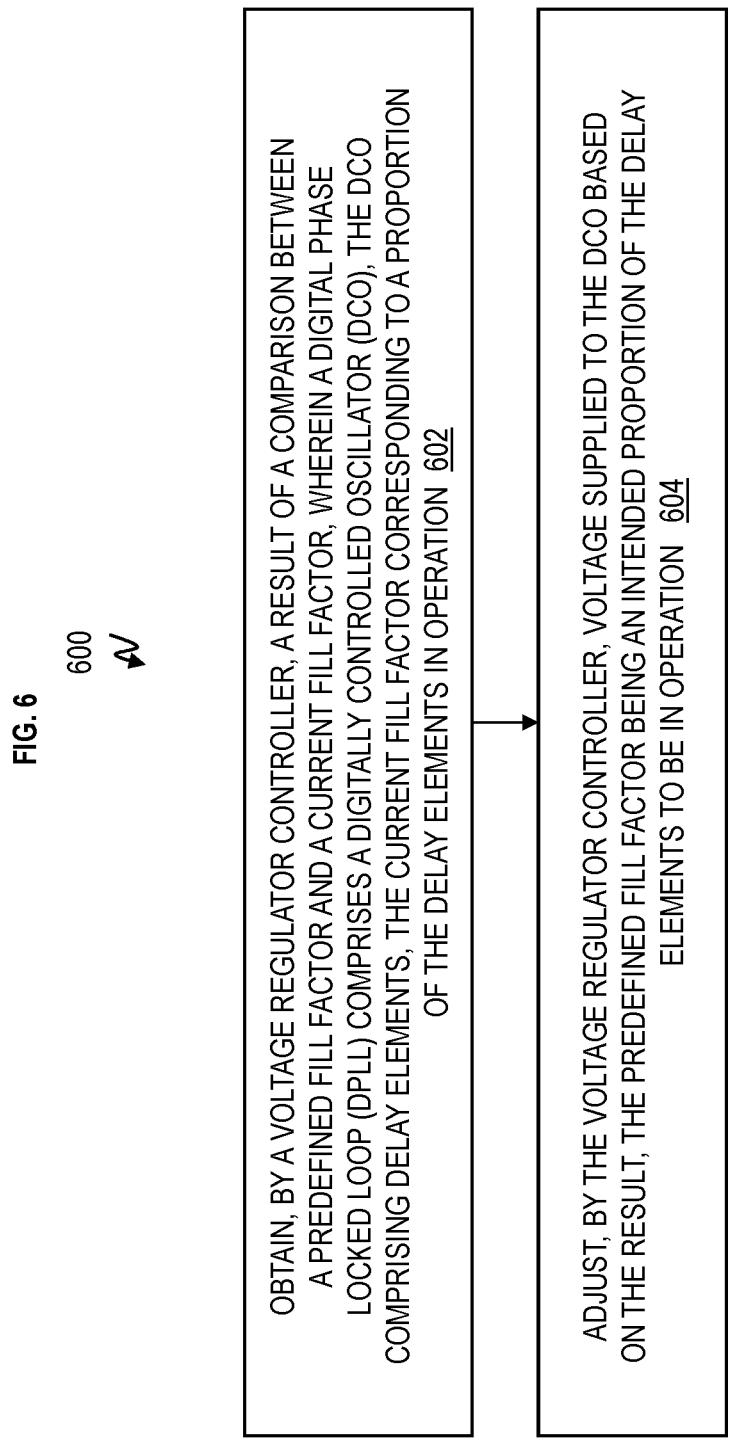
FIG. 6 depicts a flowchart of a method according to embodiments of the invention.

FIG. 6 depicts a flowchart of a method 600 according to embodiments of the invention. At block 602, the method includes obtaining, by the voltage regulator controller 112, a result of a comparison between a predefined fill factor and a current fill factor, where the digital phase locked loop (DPLL) 102 comprises a digitally controlled oscillator (DCO) 108, the DCO 108 comprising delay elements 202, the current fill factor corresponding to a proportion of the delay elements 202 in operation. At block 604, the method 600 includes adjusting, by the voltage regulator controller 112, voltage supplied (e.g., voltage VREG) to the DCO 108 based on the result, the predefined fill factor being an intended/predetermined proportion of the delay elements 202 to be in operation.

The current fill factor corresponding to the proportion of the delay elements in operation defines a percentage of the delay elements powered on to affect and/or drive a clock signal output (e.g., DCO clock signal) by the DCO 108. The voltage regulator controller 112 is operable to cause a decrease in the voltage supplied (e.g., voltage VREG) to the DCO 108 in response to the predefined fill factor being greater than the current fill factor. The voltage regulator controller 112 is operable to cause an increase in the voltage supplied to the DCO 108 in response to the predefined fill factor being less than the current fill factor. The voltage regulator controller 112 is configured to receive the predefined fill factor and the current fill factor from the DPLL 102.

The voltage regulator controller 112 is configured to receive the predefined fill factor and the current fill factor from a digital loop filter 106 in the DPLL 102. The current fill factor changes according to a current status of the delay elements 202 powered on versus the delay elements 202 powered off in the DCO 108. The voltage regulator controller 112 is coupled to a voltage regulator 114, the voltage regulator 114 being coupled to the DCO 108. The voltage regulator controller 112 is operable to cause the voltage regulator 114 to decrease the voltage supplied (e.g., voltage VREG) to the DCO 108 in response to the predefined fill factor being greater than the current fill factor.

The voltage regulator controller 112 is coupled to a voltage regulator 114, the voltage regulator 114 being coupled to the DCO, and the voltage regulator controller 112 is operable to cause the voltage regulator 114 to increase the voltage supplied (e.g., voltage VREG) to the DCO 108 in response to the predefined fill factor being less than the current fill factor.

Figure 7:
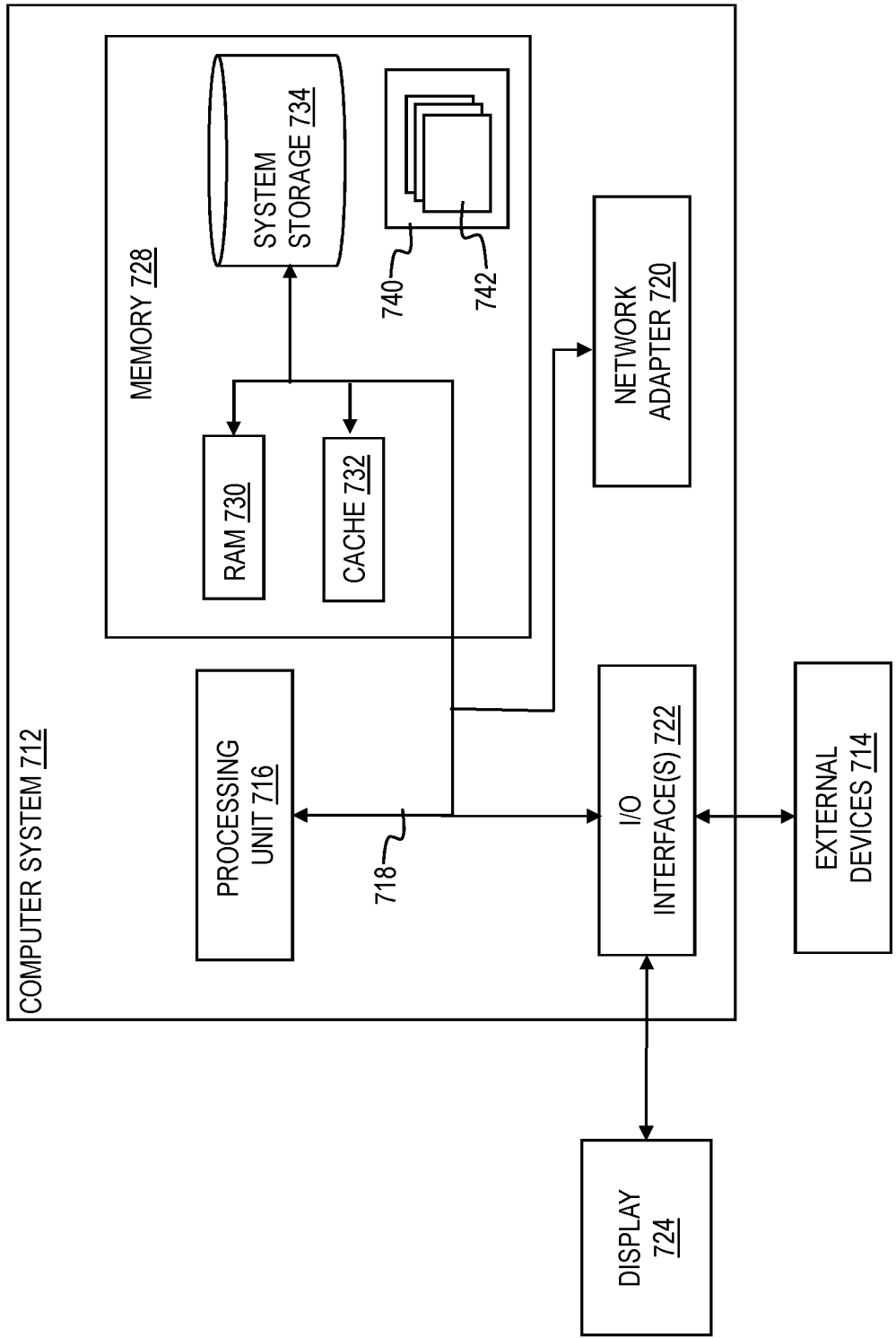
FIG. 7 depicts a schematic of an example computing system having elements and functions which operate as discussed herein in FIGS. 1-6 according to embodiments of the invention.

FIG. 7 depicts a schematic of an example computing system 712 according to embodiments of the present invention. The computer system 712 can be operational with numerous other general purpose or special purpose computing system environments or configurations. The functions and capabilities of computing system 712 can be utilized in FIGS. 1-6 to implement features of the DPLL 102, phase detector 104, digital loop filter 106, DCO 108, feedback divider 110, voltage regulator controller 112, slow voltage control loop 150, etc., according to embodiments of the invention.

Computer system 712 may be described in the general context of computer system-executable instructions, such as program modules, being executed by a computer system. Generally, program modules may include routines, programs, objects, components, logic, data structures, and so on that perform particular tasks or implement particular abstract data types.

The components of computer system/server 712 may include, but are not limited to, one or more processors or processing units 716, a system memory 728, and a bus 718 that couples various system components including system memory 728 to processor 716. Bus 718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 712 typically includes a variety of computer system readable media. Such media may be any available media that is accessible by computer system/server 712, and it includes both volatile and non-volatile media, removable and non-removable media. The system memory 728 can include computer system readable media in the form of volatile memory, such as random access memory (RAM) 730 and/or cache memory 732. Computer system 712 may further include other removable/non-removable, volatile/non-volatile computer system storage media. By way of example only, storage system 734 can be provided for reading from and writing to a nonremovable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 718 by one or more data media interfaces. Memory 728 may include at least one program product having a set (e.g., at least one) of program modules that are configured to carry out the functions of embodiments of the invention.

Program/utility 740, having a set (at least one) of program modules 742, may be stored in memory 728 by way of example, and not limitation, as well as an operating system, one or more application programs, other program modules, and program data. Each of the operating system, one or more application programs, other program modules, and program data or some combination thereof, may include an implementation of a networking environment. Program modules 742 generally carry out the functions and/or methodologies of embodiments of the invention as described herein.

Computer system 712 may also communicate with one or more external devices 714 such as a keyboard, a pointing device, a display 724, etc.; one or more devices that enable a user to interact with computer system 712; and/or any devices (e.g., network card, modem, etc.) that enable computer system 712 to communicate with one or more other computing devices. Such communication can occur via Input/Output (I/O) interfaces 722. Still yet, computer system/server 712 can communicate with one or more networks such as a local area network (LAN), a general wide area network (WAN), and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples, include but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An apparatus comprising:
    a digital phase locked loop (DPLL) comprising a digitally controlled oscillator (DCO), the DCO comprising delay elements and a current fill factor corresponding to a proportion of the delay elements in operation; and a voltage regulator controller operable to obtain a result of a comparison between a predefined fill factor having been set in advance to a fixed value and the current fill factor, the voltage regulator controller being operable to adjust voltage supplied to the DCO based on the result, the predefined fill factor indicating a predetermined proportion of the delay elements to be in operation.

2. The apparatus of claim 1, wherein the current fill factor corresponding to the proportion of the delay elements in operation defines a percentage of the delay elements powered on to drive a clock signal output by the DCO.

3. The apparatus of claim 1, wherein the voltage regulator controller is operable to cause a decrease in the voltage supplied to the DCO in response to the predefined fill factor being greater than the current fill factor.

4. The apparatus of claim 1, wherein the voltage regulator controller is operable to cause an increase in the voltage supplied to the DCO in response to the predefined fill factor being less than the current fill factor.

5. The apparatus of claim 1, wherein the voltage regulator controller is configured to receive the predefined fill factor and the current fill factor from the DPLL.

6. The apparatus of claim 1, wherein the voltage regulator controller is configured to receive the predefined fill factor and the current fill factor from a digital loop filter in the DPLL.

7. The apparatus of claim 1, wherein the current fill factor reflects a current status of the delay elements powered on in the DCO.

8. The apparatus of claim 1, wherein the current fill factor changes according to a current status of the delay elements powered on versus the delay elements powered off in the DCO.

9. The apparatus of claim 1, wherein the voltage regulator controller is coupled to a voltage regulator, the voltage regulator being coupled to the DCO; and wherein the voltage regulator controller is operable to cause the voltage regulator to decrease the voltage supplied to the DCO in response to the predefined fill factor being greater than the current fill factor.

10. The apparatus of claim 1, wherein the voltage regulator controller is coupled to a voltage regulator, the voltage regulator being coupled to the DCO; and wherein the voltage regulator controller is operable to cause the voltage regulator to increase the voltage supplied to the DCO in response to the predefined fill factor being less than the current fill factor.

11. A method comprising:

obtaining, by a voltage regulator controller, a result of a comparison between a predefined fill factor having been set in advance to a fixed value and a current fill factor, wherein a digital phase locked loop (DPLL) comprises a digitally controlled oscillator (DCO), the DCO comprising delay elements, the current fill factor corresponding to a proportion of the delay elements in operation; and adjusting, by the voltage regulator controller, voltage supplied to the DCO based on the result, the predefined fill factor indicating a predetermined proportion of the delay elements to be in operation.

12. The method of claim 11, wherein the current fill factor corresponding to the proportion of the delay elements in operation defines a percentage of the delay elements powered on to drive a clock signal output by the DCO.

13. The method of claim 11, wherein the voltage regulator controller is operable to cause a decrease in the voltage supplied to the DCO in response to the predefined fill factor being greater than the current fill factor.

14. The method of claim 11, wherein the voltage regulator controller is operable to cause an increase in the voltage supplied to the DCO in response to the predefined fill factor being less than the current fill factor.

15. The method of claim 11, wherein the voltage regulator controller is configured to receive the predefined fill factor and the current fill factor from the DPLL.

16. The method of claim 11, wherein the voltage regulator controller is configured to receive the predefined fill factor and the current fill factor from a digital loop filter in the DPLL.

17. The method of claim 11, wherein the current fill factor changes according to a current status of the delay elements powered on versus the delay elements powered off in the DCO.

18. The method of claim 11, wherein the voltage regulator controller is coupled to a voltage regulator, the voltage regulator being coupled to the DCO; and wherein the voltage regulator controller is operable to cause the voltage regulator to decrease the voltage supplied to the DCO in response to the predefined fill factor being greater than the current fill factor.

19. The method of claim 11, wherein the voltage regulator controller is coupled to a voltage regulator, the voltage regulator being coupled to the DCO; and wherein the voltage regulator controller is operable to cause the voltage regulator to increase the voltage supplied to the DCO in response to the predefined fill factor being less than the current fill factor.

20. An apparatus comprising:

a digital phase locked loop (DPLL) comprising a digitally controlled oscillator (DCO) having delay elements, a digital loop filter coupled to the DCO, and a phase detector coupled to the digital loop filter, wherein a current fill factor corresponds to a proportion of the delay elements in operation; and a voltage regulator controller operable to obtain a result of a comparison between a predefined fill factor having been set in advance to a fixed value and the current fill factor, the voltage regulator controller being operable to cause a voltage regulator to adjust voltage supplied to the DCO based on the result, the predefined fill factor indicating a predetermined proportion of the delay elements to be in operation.

* * * * *